(12) United States Patent
Gong et al.

(10) Patent No.: US 11,205,667 B2
(45) Date of Patent: Dec. 21, 2021

(54) METHOD OF PREPARING THIN FILM TRANSISTOR SUBSTRATE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Kui Gong, Beijing (CN); Dezhi Xu, Beijing (CN); Wei Tian, Beijing (CN); Honggang Gu, Beijing (CN); Yuhu Zhang, Beijing (CN)

(73) Assignees: HEFEI BOE OPTOELECTRONICS TECHNOLOGY, CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/642,949

(22) PCT Filed: May 20, 2019

(86) PCT No.: PCT/CN2019/087528
§ 371 (c)(1),
(2) Date: Feb. 28, 2020

(87) PCT Pub. No.: WO2019/223631
PCT Pub. Date: Nov. 28, 2019

(65) Prior Publication Data
US 2020/0350344 A1 Nov. 5, 2020

(30) Foreign Application Priority Data
May 24, 2018 (CN) .......................... 201810509994.8

(51) Int. Cl.
| H01L 27/00 | (2006.01) |
| H01L 29/00 | (2006.01) |
| H01L 27/12 | (2006.01) |
| H01L 29/45 | (2006.01) |
| H01L 29/66 | (2006.01) |

(Continued)

(52) U.S. Cl.
CPC ...... *H01L 27/1288* (2013.01); *H01L 27/1225* (2013.01); *H01L 27/1237* (2013.01);
(Continued)

(58) Field of Classification Search
CPC ............. H01L 27/1288; H01L 27/1237; H01L 27/1225; H01L 29/45; H01L 29/66969;
(Continued)

(56) References Cited

U.S. PATENT DOCUMENTS 5,010,027 A * 4/1991 Possin ................. H01L 21/0274
257/346
6,174,804 B1 * 1/2001 Hsu .................... H01L 21/76807
257/E21.579
(Continued)

FOREIGN PATENT DOCUMENTS

| CN | 102522467 | 6/2012 |
| CN | 102543846 | 7/2012 |

(Continued)

OTHER PUBLICATIONS

Office action from Chinese Application No. 201810509994.8 dated Apr. 13, 2020.

*Primary Examiner* — Nikolay K Yushin
(74) *Attorney, Agent, or Firm* — Calfee, Halter & Griswold LLP

(57) ABSTRACT

Disclosed is a method of preparing a thin film transistor substrate, a thin film transistor substrate, and a display apparatus. The method includes forming a conductive material layer, forming a hydrophobic insulation layer on the conductive material layer, forming a photoresist layer on the hydrophobic insulation layer, patterning the photoresist layer to form a photoresist pattern, removing a segment in the hydrophobic insulation layer that is not covered by the photoresist pattern to form a hydrophobic insulation pattern, and removing a segment in the conductive material layer that is not covered by the hydrophobic insulation pattern to form a conductive pattern.

10 Claims, 4 Drawing Sheets

(51) Int. Cl.
*H01L 29/786* (2006.01)
*G03F 1/32* (2012.01)
*G03F 7/20* (2006.01)
*G03F 7/32* (2006.01)

(52) U.S. Cl.
CPC ........ *H01L 29/45* (2013.01); *H01L 29/66969* (2013.01); *H01L 29/7869* (2013.01); *G03F 1/32* (2013.01); *G03F 7/201* (2013.01); *G03F 7/32* (2013.01)

(58) Field of Classification Search
CPC ....... H01L 29/7869; G03F 7/201; G03F 7/32; G03F 7/0035; G03F 7/0046; G03F 7/11; G03F 1/32; G03F 1/22; G03F 1/60
See application file for complete search history.

(56) References Cited

U.S. PATENT DOCUMENTS

| | | | | |
|---|---|---|---|---|
| 6,503,764 B1 * | 1/2003 | Tseng | ................ | H01L 27/10817 257/E21.019 |
| 7,456,424 B2 * | 11/2008 | Wu | ..................... | H01L 51/0067 257/40 |
| 10,559,596 B2 * | 2/2020 | Lius | ..................... | H01L 27/1214 |
| 2006/0124923 A1 * | 6/2006 | Wu | ..................... | H01L 51/0067 257/40 |
| 2015/0357480 A1 | 12/2015 | Yu et al. | | |
| 2019/0296055 A1 * | 9/2019 | Lius | ..................... | H01L 27/124 |

FOREIGN PATENT DOCUMENTS

| | | |
|---|---|---|
| CN | 102610516 | 7/2012 |
| CN | 102916016 | 2/2013 |
| CN | 102969333 | 3/2013 |
| CN | 104409332 | 3/2015 |
| CN | 104617111 | 5/2015 |
| CN | 105742186 | 7/2016 |
| CN | 105789218 | 7/2016 |
| CN | 108666325 | 10/2018 |

* cited by examiner

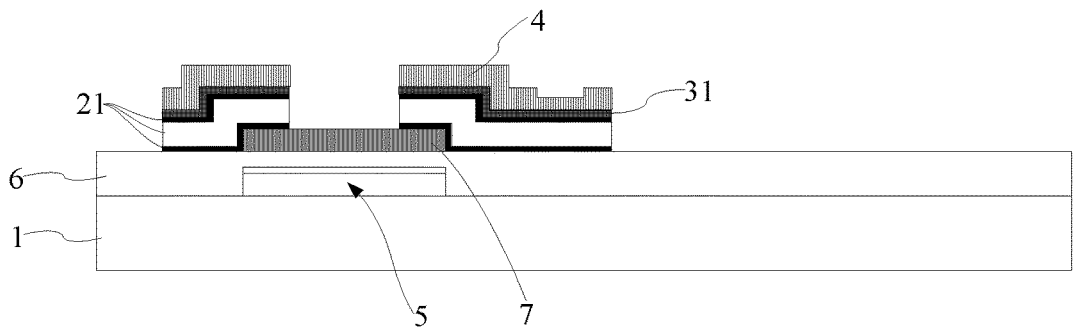

FIG. 6

S104 exposing photoresist layer with halftone mask such that photoresist layer is divided into photoresist completely removed region, photoresist partially reserved region and photoresist completely reserved region — S401 developing photoresist layer, to completely remove photoresist in photoresist completely removed region, remove part of photoresist in photoresist partially reserved region and reserve remaining part of photoresist in photoresist partially reserved region, and completely reserve photoresist in photoresist completely reserved region — S402

FIG. 7

S107 completely removing remaining part of photoresist in photoresist partially reserved region to expose part of hydrophobic insulation pattern — S701 removing part of hydrophobic insulation pattern to expose part of conductive pattern — S702

FIG. 8

METHOD OF PREPARING THIN FILM TRANSISTOR SUBSTRATE

RELATED APPLICATIONS

This application is a 35 U.S.C. 371 national stage application of PCT International Application No. PCT/CN2019/087528, filed on May 20, 2019, which claims the priority to Chinese Patent Application No. 201810509994.8, filed on May 24, 2018, the entire contents of which are hereby incorporated by reference.

TECHNICAL FIELD

The present disclosure relates to the field of display technology, and in particular, to a method of preparing a thin film transistor substrate, a thin film transistor substrate, and a display apparatus.

BACKGROUND

Oxide thin film transistors (TFTs) have been used in flat panel display production technology. During the preparation of the electrode layer used incorporation with the oxide thin film transistors, the problem of photoresist peeling may occur.

SUMMARY

According to an exemplary embodiment, a method of preparing a thin film transistor substrate is provided. The method comprises: forming a conductive material layer; forming a hydrophobic insulation layer on the conductive material layer; forming a photoresist layer on the hydrophobic insulation layer; patterning the photoresist layer to form a photoresist pattern; removing a segment in the hydrophobic insulation layer that is not covered by the photoresist pattern to form a hydrophobic insulation pattern; and removing a segment in the conductive material layer that is not covered by the hydrophobic insulation pattern to form a conductive pattern.

In some exemplary embodiments, the conductive material layer comprises a source-drain material layer, and the conductive pattern comprises a source electrode and a drain electrode.

In some exemplary embodiments, the method further comprises forming a via in the hydrophobic insulation pattern to expose a part of the conductive pattern.

In some exemplary embodiments, the patterning the photoresist layer to form the photoresist pattern comprises: exposing the photoresist layer with a halftone mask such that the photoresist layer is divided into a photoresist completely removed region, a photoresist partially reserved region, and a photoresist completely reserved region, wherein an orthographic projection of a combination of the photoresist completely reserved region and the photoresist partially reserved region on the conductive material layer coincides with the conductive pattern, and developing the photoresist layer to completely remove the photoresist in the photoresist completely removed region, remove a part of the photoresist in the photoresist partially reserved region and reserve a remaining part of the photoresist in the photoresist partially reserved region, and completely reserve the photoresist in the photoresist completely reserved region, wherein the photoresist pattern comprises the photoresist in the photoresist completely reserved region and the remaining part of the photoresist in the photoresist partially reserved region.

The forming the via in the hydrophobic insulation pattern to expose the part of the conductive pattern includes: completely removing the remaining part of the photoresist in the photoresist partially reserved region to expose a part of the hydrophobic insulation pattern; and removing the part of the hydrophobic insulation pattern to expose the part of the conductive pattern.

In some exemplary embodiments, the step of completely removing the remaining part of the photoresist in the photoresist partially reserved region comprises performing an ashing treatment on the photoresist in the photoresist completely reserved region and the remaining part of the photoresist in the photoresist partially reserved region to partially remove the photoresist in the photoresist completely reserved region and completely remove the remaining part of the photoresist in the photoresist partially reserved region.

In some exemplary embodiments, the step of completely removing the remaining part of the photoresist in the photoresist partially reserved region comprises exposing and developing the photoresist in the photoresist completely reserved region and the remaining part of the photoresist in the photoresist partially reserved region to partially remove the photoresist in the photoresist completely reserved region and completely remove the remaining part of the photoresist in the photoresist partially reserved region.

In some exemplary embodiments, the conductive material layer comprises two diffusion prevention layers and a copper layer between the two diffusion prevention layers.

In some exemplary embodiments, a material of one of the two diffusion prevention layers comprises a metal, a metal nitride, or a metal alloy.

In some exemplary embodiments, a material of the hydrophobic insulation layer comprises silicon nitride.

In some exemplary embodiments, the method further comprises, prior to forming the conductive material layer: forming a gate electrode; forming a gate insulation layer on the gate electrode; and forming an active layer on the gate insulation layer. The forming the conductive material layer comprises forming the conductive material layer on the active layer.

In some exemplary embodiments, the method further comprises, subsequent to removing the segment in the conductive material layer that is not covered by the hydrophobic insulation pattern to form the conductive pattern: forming an active layer on the conductive pattern; forming a gate insulation layer on the active layer; and forming a gate electrode on the gate insulation layer.

According to another exemplary embodiment, a thin film transistor substrate prepared by the method according to an embodiment of the present disclosure is provided, which comprises: a conductive pattern; and a hydrophobic insulation pattern on the conductive pattern.

According to yet another exemplary embodiment, a display apparatus is provided comprising the thin film transistor substrate according to an embodiment of the present disclosure.

BRIEF DESCRIPTION OF THE DRAWINGS

FIGS. 2-6 schematically illustrate cross-sectional views of intermediate structures of a thin film transistor substrate in the process of a method of preparing a thin film transistor substrate according to an exemplary embodiment;

FIGS. 7-8 schematically illustrate flowcharts of a method of preparing a thin film transistor substrate according to another exemplary embodiment;

DETAILED DESCRIPTION

Figure 1:
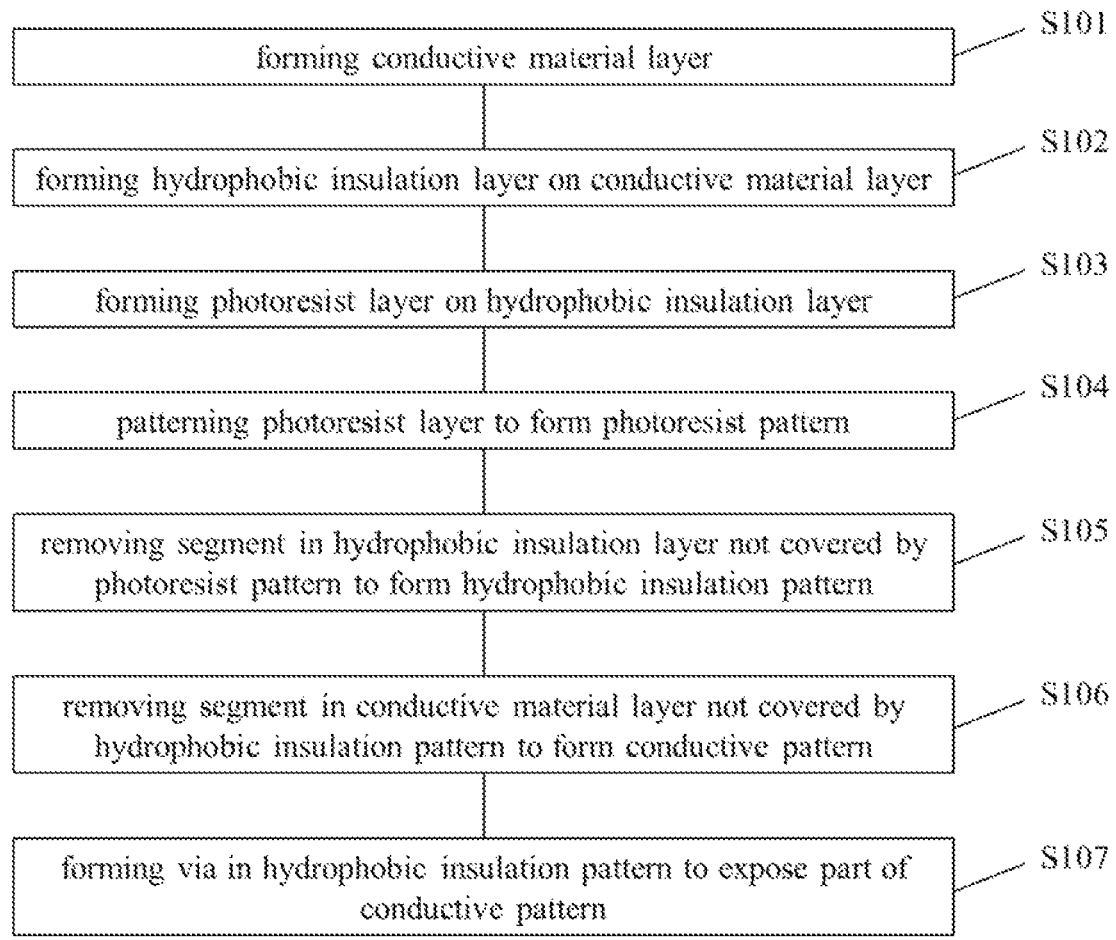
FIG. 1 schematically illustrates a flowchart of a method of preparing a thin film transistor substrate according to an exemplary embodiment.

The technical solutions in the embodiments of the present disclosure will be clearly and completely described below with reference to the drawings of the exemplary embodiments. It will be apparent that the described embodiments are only a part of the embodiments of the present disclosure, instead of all of the embodiments. All other embodiments obtained by a person having ordinary skill in the art, based on the exemplary embodiments, without making inventive efforts, fall within the protection scope of the present disclosure.

Among the related production technologies of the flat panel displays, TFTs that have been industrialized mainly comprise the amorphous silicon TFTs, the polycrystalline silicon TFTs, and the single crystal silicon TFTs. The amorphous silicon TFTs are commonly used to in the preparation of the array substrates of the flat panel displays. With the development of technology, the oxide TFTs have appeared. The oxide TFTs have the advantage of high carrier mobility, which makes the volume of the TFT very small, improves the resolution of the flat panel displays, and provides a better display effect. In addition, the film uniformity of the oxide TFTs for a large-area panel is more excellent. Moreover, the oxide TFTs require fewer materials, lower process cost, lower process temperature, and have higher transparency. The application of oxide TFTs, therefore, has attracted much attention from the industry.

The oxide material commonly used in an active layer of the oxide TFT may be, for example, indium gallium zinc oxide (IGZO). The etching solution used to make the electrode used in corporation with the oxide material should not cause damage to the oxide material. Currently, copper (Cu) electrodes are generally used for oxide TFTs because the etching solution of Cu can meet the above requirements. However, when the Cu electrode is at a high temperature, Cu ions may diffuse into the oxide semiconductor, which deteriorates the TFT performance. One solution to this problem is to use a diffusion prevention layer (e.g., barrier) to prevent the diffusion of Cu ions. In this case, the structure of the copper electrode may be, for example, a diffusion prevention layer/a copper layer, or a diffusion prevention layer/a copper layer/a diffusion prevention layer, or another double or triple layer structure of copper and diffusion prevention layer. The material of the diffusion prevention layer may include a metal (for example, Ti, Mo, etc.), a metal nitride (for example, MoN, etc.), a metal alloy (for example, MoNb, etc.), or other suitable materials.

The etching solution of Cu is generally a hydrogen peroxide-based etching solution. Since the viscosity of this etching solution is relatively low, when it is used to etch the Cu electrode layer, it is easier to enter between the photoresist and the Cu metal (or the diffusion prevention layer), so that the photoresist is peeled off, resulting in undesirable etching on the Cu electrode that leads to fracture or damage. This reduces the yield of the TFT.

Taking a copper electrode with a triple-layer structure of MoNb/Cu/MoNb as an example, in the process of making a copper electrode pattern using a photoresist as an anti-etching layer, the photoresist pattern on the MoNb layer often peels off during the etching process, causing defects in the resulting electrode pattern. Studies have shown that the adhesion between the photoresist and MoNb is affected by factors in addition to molecular bonding. For example, the hydrophilicity of the MoNb surface can affect the adhesion of the photoresist, which can cause lift-off and lateral corrosion. In practical applications, surface treatment technology is often used to increase the contact angle of liquid molecules on the surface of MoNb, thereby reducing the hydrophilicity of the surface of the metal MoNb. In practical applications, however, the effect of the surface treatment technology is not very significant, and defects in the metal electrode pattern often occur. Therefore, a solution to the above-mentioned problem of photoresist peeling is in urgent need.

Figure 2:
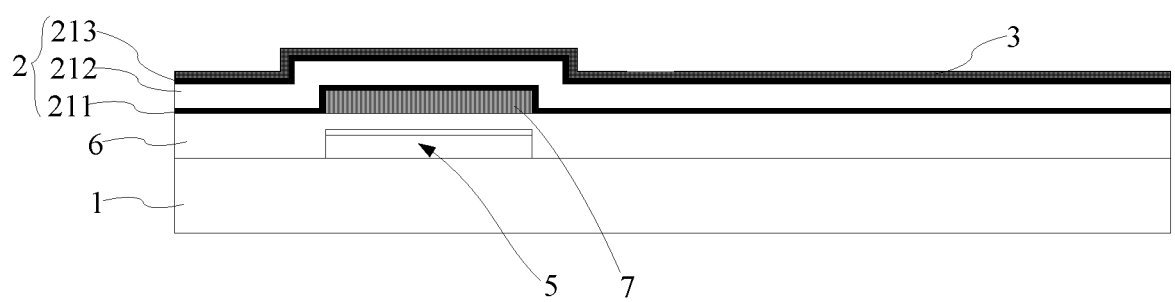

According to an exemplary embodiment, a method of preparing a thin film transistor substrate is provided. FIG. 1 schematically illustrates a flowchart of a method of preparing a thin film transistor substrate according to an exemplary embodiment. FIG. 2 schematically illustrates cross-sectional views of various intermediate structures of the thin film transistor substrate in the method of preparing the thin film transistor substrate according to an exemplary embodiment. The method includes the following steps:

Step S101, forming a conductive material layer 2;

Step S102, forming a hydrophobic insulation layer 3 on the conductive material layer 2;

Step S103: forming a photoresist layer 40 on the hydrophobic insulation layer 3;

Step S104, patterning the photoresist layer 40 to form a photoresist pattern 4;

Step S105, removing the segment in the hydrophobic insulation layer 3 that is not covered by the photoresist pattern 4 to form a hydrophobic insulation pattern 31; and Step S106, removing the segment in the conductive material layer 2 that is not covered by the hydrophobic insulation pattern 31 to form a conductive pattern.

Figure 3:
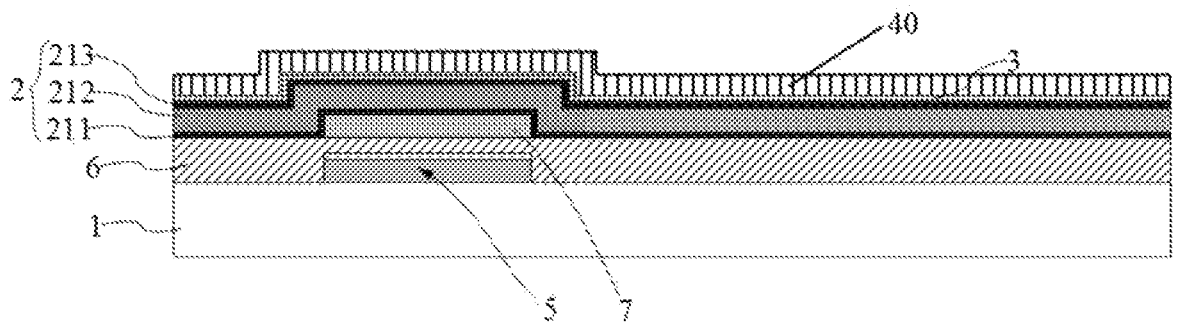
Figure 4:
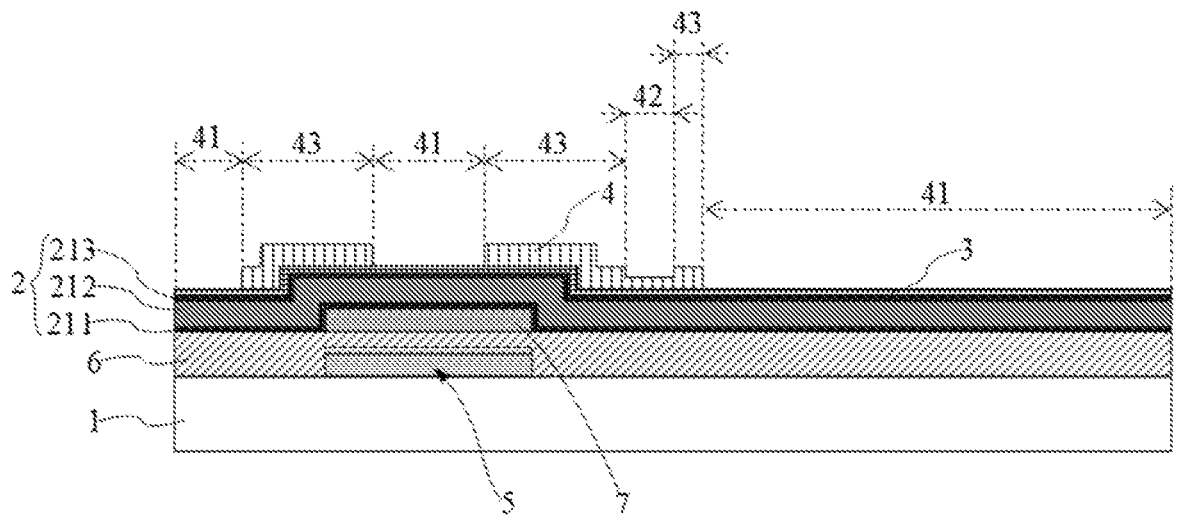
Figure 5:
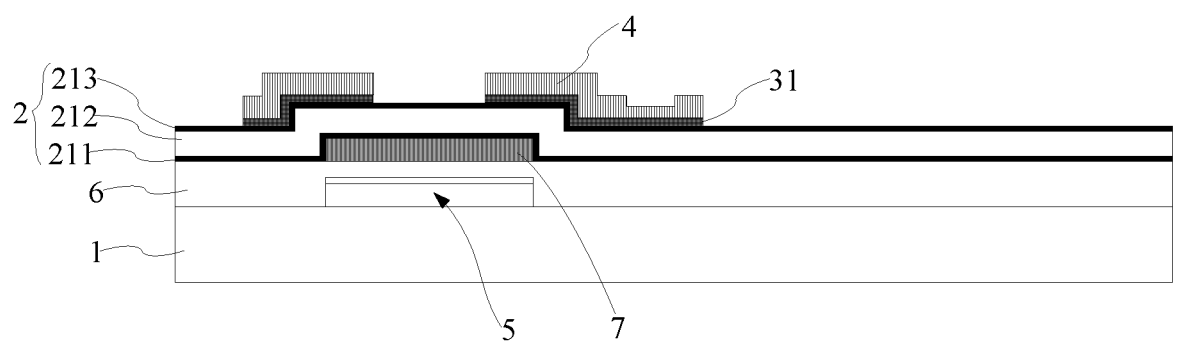

This method is described in detail below. In the above method, the conductive material layer 2 may be formed on a base substrate 1 (step S101). In some exemplary embodiments, the conductive material layer 2 includes two diffusion prevention layers 211, 213 and a metal layer, such as a copper layer 212, sandwiched between the two diffusion prevention layers. By providing the diffusion prevention layers 211 and 213 on both sides of the copper layer 212, when the copper layer 212 is at a high temperature, the diffusion prevention layers 211 and 213 can prevent the copper ions in the copper layer 212 from diffusing into other layers of the TFT to cause adverse effects on these layers, thereby guaranteeing the performance of these layers. In a more specific exemplary embodiment, a material of one or more of the two diffusion prevention layers 211, 213 includes a metal, a metal nitride, or a metal alloy. In some exemplary embodiments, the conductive material layer is used to form the source and drain electrodes of the thin film transistor substrate, that is, the conductive material layer includes a source-drain material layer, and the conductive pattern includes the source and drain electrodes. After the conductive material layer 2 is formed, a hydrophobic insulation layer 3 is formed on the conductive material layer 2 (step S102). FIG. 2 schematically illustrates a cross-sectional view of an intermediate structure of a TFT substrate according to an exemplary embodiment in which a hydrophobic insulation layer is formed. In some exemplary embodiments, the material of the hydrophobic insulation layer 3 includes silicon nitride. Silicon nitride has a hard texture, good abrasion resistance and hydrophobicity, as well as a small pinhole density, making it difficult for gas and water vapor to penetrate. Therefore, the adhesion between the hydrophobic insulation layer 3 and the photoresist layer 40 is better, which is advantageous for the etching of the conductive material layer. Then, a photoresist layer 40 is formed on the hydrophobic insulation layer 3 (step S103). FIG. 3 schematically illustrates a cross-sectional view of an intermediate structure of a TFT substrate according to an exemplary embodiment in which a photoresist layer is formed. Thereafter, a patterning process is performed on the photoresist layer 40 to form a photoresist pattern 4 (step S104). FIG. 4 schematically illustrates a cross-sectional view of an intermediate structure of a TFT substrate according to an exemplary embodiment in which a photoresist pattern is formed. After this step, a part of the hydrophobic insulation layer 3 is covered by the photoresist pattern 4, and another part of the hydrophobic insulation layer 3 is not covered by the photoresist pattern 4. Since the hydrophobic insulation layer 3 has good hydrophobicity, the adhesion between the hydrophobic insulation layer 3 and the photoresist pattern 4 is strong. Therefore, during the manufacturing process of the conductive pattern, the photoresist pattern 4 is not easy to peel off, and the conductive pattern is not prone to defects. After that, the segment in the hydrophobic insulation layer 3 that is not covered by the photoresist pattern 4 is removed to form a hydrophobic insulation pattern 31 (step S105). FIG. 5 schematically illustrates a cross-sectional view of an intermediate structure of a TFT substrate according to an exemplary embodiment in which a hydrophobic insulation pattern is formed. For example, phosphoric acid may be used to etch the hydrophobic insulation layer 3 to form a hydrophobic insulation pattern 31, after which, a part of the conductive material layer 2 is covered by the hydrophobic insulation pattern 31, and another part of the conductive material layer is not covered by the hydrophobic insulation pattern 31. After that, the segment in the conductive material layer 2 that is not covered by the hydrophobic insulation pattern 31 is removed to form a conductive pattern (step S106). FIG. 6 schematically illustrates a cross-sectional view of an intermediate structure of a TFT substrate according to an exemplary embodiment in which a conductive pattern is formed. In the case where the conductive material layer 2 includes a copper layer, the conductive material layer 2 may be etched using a copper etching solution to form a conductive pattern.

Since the adhesion between the hydrophobic insulation layer 3 and the photoresist layer 40 on the conductive material layer 2 is good, that is, the hydrophobic insulation pattern 31 and the photoresist pattern 4 are relatively firmly bonded, therefore, in the process of etching the conductive material layer 2 by using a metal etching solution, the metal etching solution is difficult to drill between the hydrophobic insulation pattern 31 and the photoresist pattern 4 (that is, the lateral etching of the metal etching solution is more difficult), thereby avoiding the contact between the side of the photoresist pattern 4 facing the conductive material layer 2 and the metal etching solution, which causes the photoresist pattern 4 to peel off. This is beneficial to avoid defects such as breakage and damage of the conductive pattern. The above method can be used to prepare a TFT substrate including metal oxide TFTs. The metal oxide TFT can use copper as an electrode material. Therefore, in the above method, the material of the conductive material layer 2 may include copper. The conductive pattern formed according to the above method may be a copper electrode. When etching the copper layer, a copper etchant can be used for etching. Due to the good adhesion between the hydrophobic insulation layer 3 and the photoresist layer 40 on the copper layer, in the process of using the copper etching solution to etch the copper layer, it is avoided that the copper etching solution is in contact with the side of the photoresist pattern 4 facing the conductive material layer 2, which cause (the segment of) the photoresist pattern 4 to peel off. This is beneficial to avoid the defects such as breakage and damage of the copper electrode. In addition, phosphoric acid can be used to etch the segment in the hydrophobic insulation layer 3 that is not covered by the photoresist pattern 4. Because the acidity of phosphoric acid is relatively weak, its effect on other layers is small or even negligible.

In order that the conductive pattern can be electrically connected to the pixel electrode, in some exemplary embodiments, the method further includes forming a first via 311 in the hydrophobic insulation pattern 31, the first via exposing a part of the conductive pattern (Step S107). One approach is to use a mask to expose the photoresist pattern 4 and develop the exposed photoresist pattern 4 to expose the segment in the hydrophobic insulation pattern 31 to be etched to form the first via 311. Then, the segment is etched to form the first via 311 and expose the segment of the conductive pattern to be electrically connected to the pixel electrode. This approach however requires a separate mask, thereby increasing the cost and complexity of the process.

FIG. 7 schematically illustrates a flowchart of a method of preparing a thin film transistor substrate according to another exemplary embodiment. As shown in FIG. 7, the step of patterning the photoresist layer 40 to form the photoresist pattern 4 (step S104) includes: exposing the photoresist layer 40 with a halftone mask such that the photoresist layer 40 is divided into a photoresist completely removed region 41, a photoresist partially reserved region 42 and a photoresist completely reserved region 43 (step S401), wherein an orthographic projection of a combination of the photoresist completely reserved region 43 and the photoresist partially reserved region 42 on the conductive material layer 2 coincides with the conductive pattern; and developing the photoresist layer 40, to completely remove the photoresist in the photoresist completely removed region 41, remove a part of the photoresist in the photoresist partially reserved region 42 and reserve a remaining part of the photoresist in the photoresist partially reserved region 42, and completely reserve the photoresist in the photoresist completely reserved region 43, with the photoresist pattern 4 including the photoresist in the photoresist completely reserved region 43 and the remaining part of the photoresist in the photoresist partially reserved region 42 (step S402). FIG. 4 schematically illustrates a cross-sectional view of the intermediate structure of the TFT substrate after step S402 is finished.

By means of the halftone mask, it is possible to make the photoresist layer have multiple (for example, two or more) different heights through only one mask. Thereafter, the photoresist, that have been exposed using the halftone mask, may be further processed without using a mask to remove the photoresist having a specific height, thereby exposing a specific region of the layer covered by the photoresist.

Figure 9:
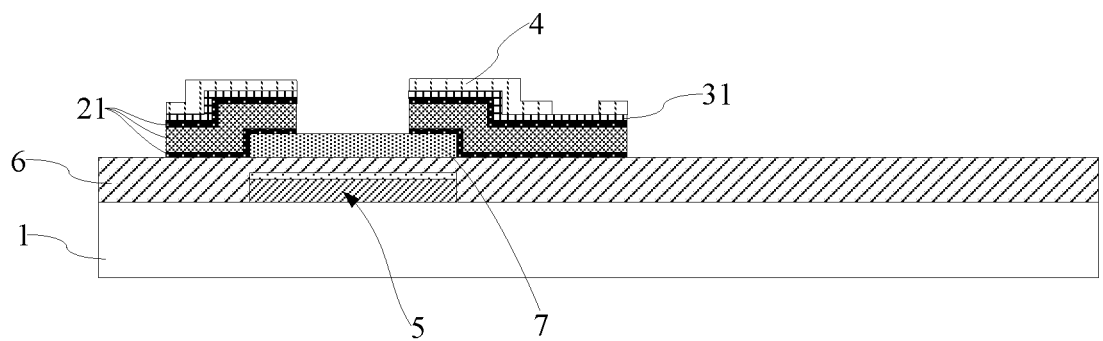
FIGS. 9-10 schematically illustrate cross-sectional views of other intermediates structure of the thin film transistor substrate in the process of the method of preparing the thin film transistor substrate according to the exemplary embodiment.
Figure 10:
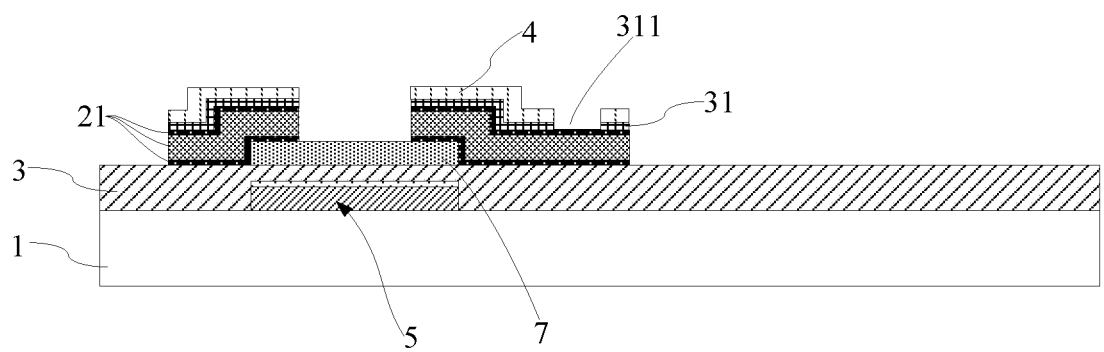

FIG. 8 schematically illustrates a flowchart of a method of preparing a thin film transistor substrate according to still another exemplary embodiment of the present disclosure. In some embodiments, the step of forming the via in the hydrophobic insulation pattern 31 to expose a part of the conductive pattern (step S107) includes: completely removing the remaining part of the photoresist in the photoresist partially reserved region 42 (step S701), to expose a part of the hydrophobic insulation pattern 31; and removing the part of the hydrophobic insulation pattern 31 (step S702) to expose the part of the conductive pattern. FIG. 9 schematically illustrates a cross-sectional view of an intermediate structure of a TFT substrate after the step S701 is finished. FIG. 10 schematically illustrates a cross-sectional view of an intermediate structure of the TFT substrate after the step S702 is finished.

In the above steps, the photoresist in the photoresist partially reserved region 42 and the photoresist in the photoresist completely reserved region 41 are removed as a whole, for example, the photoresist in the photoresist partially reserved region is thinned by the same thickness as the photoresist in the photoresist completely reserved region. Since the thickness of the photoresist in the photoresist partially reserved region 42 and the thickness of the photoresist in the photoresist completely reserved region 41 are different after exposure using the halftone mask and developing, when continuing removing of the photoresist in the two regions by the same thickness, the photoresist completely reserved region may still have the photoresist, whereas the photoresist in the photoresist partially reserved region has been completely removed.

In some exemplary embodiments, the step of completely removing the remaining part of the photoresist in the photoresist partially reserved region 42 (step S701) to expose a part of the hydrophobic insulation pattern 31 may include: performing an ashing treatment on the photoresist in the photoresist completely reserved region and the remaining part of the photoresist in the photoresist partially reserved region, to partially remove the photoresist in the photoresist completely reserved region and completely remove the remaining part of the photoresist in the photoresist partially reserved region. The ashing of the photoresist is a process of removing the photoresist. Specifically, when the photoresist is placed in a plasma environment (for example, an oxygen plasma environment), the photoresist will react with the oxygen to generate some volatile substances, such as CO, $CO_2$, $H_2O$ and $N_2$, etc. It should be understood that after the ashing treatment, the volume of the remaining photoresist is smaller, and the structure previously covered by the ashed photoresist may be exposed. In an exemplary embodiment, since the thickness of the remaining part of the photoresist in the photoresist partially reserved region is smaller than the thickness of the photoresist in the photoresist completely reserved region, the remaining part of the photoresist in the photoresist partially reserved region may be completely removed and the photoresist in the photoresist completely reserved region may be partially removed by controlling conditions of the ashing process such as power, plasma gas pressure, flow rate, etc. The part of the hydrophobic insulation pattern 31 corresponding to the remaining part of the photoresist that have been completely removed may be removed in step S702, to expose a part of the conductive pattern. This part of the conductive pattern can be brought into connection with a pixel electrode 9 when the TFT substrate is applied.

In some exemplary embodiments, phosphoric acid may be used to etch the hydrophobic insulation layer 3 to form a first via 311 for connecting the source-drain electrode 21 to the pixel electrode.

Figure 11:
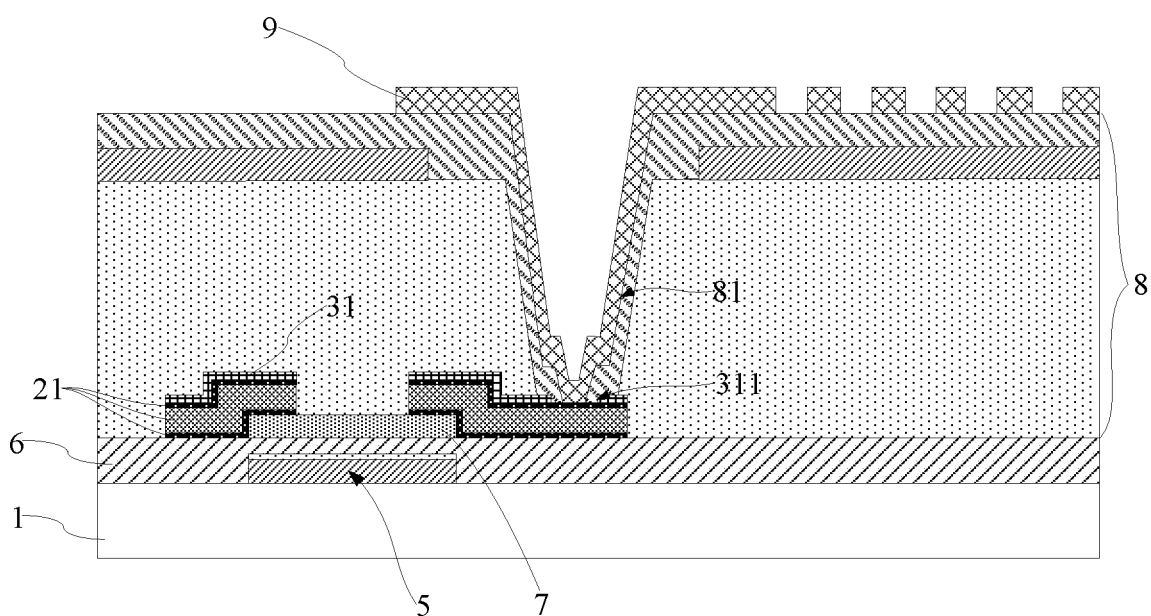
FIG. 11 schematically illustrates a cross-sectional view of a thin film transistor substrate according to an exemplary embodiment in which functional layers have been formed.

After the source-drain electrode 21 is formed, a plurality of functional layers 8 may further be formed on the source-drain electrode 21. FIG. 11 schematically illustrates a cross-sectional view of a TFT substrate in which functional layers are formed. A second via 81 in communication with the first via 311 is provided, which passes through the plurality of functional layers 8. The pixel electrode 9 may be formed on or within the plurality of functional layers 8, and the pixel electrode 9 is electrically connected to the source-drain electrode 21 through the first via 311 and the second via 81.

The method of preparing a TFT substrate according to the present disclosure may be used to prepare a bottom gate type TFT, and may also be used to prepare a top gate type TFT.

When the TFT being prepared is a bottom gate type TFT, the method further includes, prior to forming the conductive material layer 2, forming a patterned gate layer (i.e., the gate electrode 5) on the base substrate 1; forming a gate insulation layer 6 on the gate electrode 5; and forming an active layer 7 on the gate insulation layer 6. Moreover, the step of forming the conductive material layer 2 may specifically include forming the conductive material layer 2 on the active layer 7.

When the TFR being prepared is a top gate type TFT, the method further includes, subsequent to removing the segment in the conductive material layer that is not covered by the hydrophobic insulation pattern to form the conductive pattern, i.e., after the source-drain 21 is formed, forming an active layer 7 on the source-drain electrodes 21; forming a gate insulation layer 6 on the active layer 7; and, forming a gate electrode 5 on the gate insulation layer 6.

In some exemplary embodiments, the gate electrode 5 may be a double-layer structure composed of a metal layer (such as a copper layer or an aluminum layer) and a diffusion prevention layer different from the aforementioned diffusion prevention layer, which is not limited in the present application. The material of the diffusion prevention layer may also be a metal (such as Ti or Mo, etc.), a metal oxide (such as MoN, etc.), a metal alloy (such as MoNb, etc.), or other suitable materials. The present application does not limit this.

In some exemplary embodiments, the material of the gate insulation layer 6 may be silicon nitride, silicon dioxide, or other suitable materials.

According to another aspect of the present disclosure, there is further provided a TFT substrate prepared by the method of preparing a TFT substrate according to any one of the above embodiments. The TFT substrate includes a conductive pattern and a hydrophobic insulation pattern on the conductive pattern. In some exemplary embodiments, the conductive pattern includes a source-drain electrode 21. In some exemplary embodiments, the hydrophobic insulation pattern includes a first via. The first via may be used to electrically connect the source-drain electrode 21 with the pixel electrode 9.

According to yet another exemplary embodiment, there is further provided a display apparatus, which includes a TFT substrate according to any of the embodiments of the present disclosure.

In the above-mentioned TFT substrate, a hydrophobic insulation pattern exists on the conductive pattern, and a photoresist pattern exists on the hydrophobic insulation pattern. Since the photoresist pattern has a good adhesion with the hydrophobic insulation pattern, the peeling off of the photoresist layer caused by the lateral drilling of the etching solution can be avoided when etching the conductive material layer, which is beneficial to improving the yield of the TFT substrate.

As will be apparent to those skilled in the art, many different ways of performing the methods of the exemplary embodiments are possible. For example, the order of the steps can be altered, or some steps can be performed in parallel. In addition, other method steps can be inserted between the given steps. The inserted steps may represent improvements to the method such as those described herein, or may be independent from the method. In addition, a given step may not be fully completed before the next step begins.

It will be appreciated that the above embodiments are described by way of example only. Although the embodiments have been illustrated and described in detail in the drawings and the foregoing description, such illustrations and descriptions are to be considered illustrative or exemplary, rather than restrictive, and the disclosure is not limited to the disclosed embodiments. In addition, it should be understood that the elements in the drawings are not necessarily drawn to scale, and the dimensions shown in the drawings do not represent the actual size or relative size of the elements.

Other variations to the disclosed exemplary embodiments can be understood and achieved by those skilled in the art when practicing the claimed subject matter, from a study of the accompanying drawings, the disclosure, and the appended claims. In the claims, the word "comprise" or "comprising" does not exclude other elements or steps, and the indefinite article "a" or "an" does not exclude plural. The mere fact that certain measures are recited in mutually different dependent claims does not indicate that a combination of these measures cannot be used to advantage. Any reference signs in the claims should not be construed as limiting the scope. The use of the words such as "first", "second", etc. does not imply any ordering. These words will be interpreted as names.

What is claimed is:

1. A method of preparing a thin film transistor substrate, comprising:
   forming a conductive material layer, wherein the conductive material layer comprises two diffusion prevention layers and a copper layer between the two diffusion prevention layers,
   forming a hydrophobic insulation layer on the conductive material layer,
   forming a photoresist layer on the hydrophobic insulation layer,
   patterning the photoresist layer to form a photoresist pattern,
   removing a segment in the hydrophobic insulation layer that is not covered by the photoresist pattern to form a hydrophobic insulation pattern, and
   removing a segment in the conductive material layer that is not covered by the hydrophobic insulation pattern to form a conductive pattern.

2. The method of claim 1, wherein the conductive material layer comprises a source-drain material layer, and the conductive pattern comprises a source electrode and a drain electrode.

3. The method of claim 1, wherein a material of one of the two diffusion prevention layers comprises a metal, a metal nitride, or a metal alloy.

4. The method of claim 1, wherein a material of the hydrophobic insulation layer comprises a silicon nitride.

5. The method of claim 1, further comprising, prior to forming the conductive material layer:
   forming a gate electrode,
   forming a gate insulation layer on the gate electrode, and
   forming an active layer on the gate insulation layer;
   and forming the conductive material layer comprises:
   forming the conductive material layer on the active layer.

6. The method of claim 1, further comprising, subsequent to removing the segment in the conductive material layer that is not covered by the hydrophobic insulation pattern to form the conductive pattern:
   forming an active layer on the conductive pattern,
   forming a gate insulation layer on the active layer, and
   forming a gate electrode on the gate insulation layer.

7. The method of claim 1, further comprising:
   forming a via in the hydrophobic insulation pattern to expose a part of the conductive pattern.

8. The method of claim 7, wherein patterning the photoresist layer to form the photoresist pattern comprises:
   exposing the photoresist layer with a halftone mask, such that the photoresist layer is divided into a photoresist completely removed region, a photoresist partially reserved region and a photoresist completely reserved region, wherein an orthographic projection of a combination of the photoresist completely reserved region and the photoresist partially reserved region on the conductive material layer coincides with the conductive pattern, and
   developing the photoresist layer, to completely remove a photoresist in the photoresist completely removed region, remove a part of a photoresist in the photoresist partially reserved region and reserve a remaining part of the photoresist in the photoresist partially reserved region and completely reserve a photoresist in the photoresist completely reserved region, wherein the photoresist pattern comprises the photoresist in the photoresist completely reserved region and the remaining part of the photoresist in the photoresist partially reserved region; and
   forming the via in the hydrophobic insulation pattern to expose the part of the conductive pattern comprises:
   completely removing the remaining part of the photoresist in the photoresist partially reserved region, to expose a part of the hydrophobic insulation pattern, and
   removing the part of the hydrophobic insulation pattern, to expose the part of the conductive pattern.

9. The method of claim 8, wherein completely removing the remaining part of the photoresist in the photoresist partially reserved region comprises:
   performing an ashing treatment on the photoresist in the photoresist completely reserved region and the remaining part of the photoresist in the photoresist partially reserved region, to partially remove the photoresist in the photoresist completely reserved region and completely remove the remaining part of the photoresist in the photoresist partially reserved region.

10. The method of claim 8, wherein completely removing the remaining part of the photoresist in the photoresist partially reserved region comprises:
    exposing and developing the photoresist in the photoresist completely reserved region and the remaining part of the photoresist in the photoresist partially reserved region, to partially remove the photoresist in the photoresist completely reserved region and completely remove the remaining part of the photoresist in the photoresist partially reserved region.

* * * * *

UNITED STATES PATENT AND TRADEMARK OFFICE
CERTIFICATE OF CORRECTION

PATENT NO. : 11,205,667 B2
APPLICATION NO. : 16/642949
DATED : December 21, 2021
INVENTOR(S) : Kui Gong et al.

It is certified that error appears in the above-identified patent and that said Letters Patent is hereby corrected as shown below:

On the Title Page

The first Assignee in item (73):
HEFEI BOE OPTOELECTRONICS TECHNOLOGY, CO., LTD. should read ---HEFEI BOE OPTOELECTRONICS TECHNOLOGY CO., LTD.---.

Signed and Sealed this
Second Day of August, 2022

Katherine Kelly Vidal
*Director of the United States Patent and Trademark Office*